(12) United States Patent
Brown et al.

(10) Patent No.: US 10,916,486 B2
(45) Date of Patent: Feb. 9, 2021

(54) SEMICONDUCTOR DEVICE INCLUDING SILANE BASED ADHESION PROMOTER AND METHOD OF MAKING

(71) Applicant: Intel Corporation, Santa Clara, CA (US)

(72) Inventors: Andrew J. Brown, Phoenix, AZ (US); Chi-Mon Chen, Chandler, AZ (US); Robert Alan May, Chandler, AZ (US); Amanda E. Schuckman, Chandler, AZ (US); Wei-Lun Kane Jen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/335,527

(22) PCT Filed: Sep. 26, 2016

(86) PCT No.: PCT/US2016/053818
§ 371 (c)(1),
(2) Date: Mar. 21, 2019

(87) PCT Pub. No.: WO2018/057040
PCT Pub. Date: Mar. 29, 2018

(65) Prior Publication Data
US 2019/0355642 A1    Nov. 21, 2019

(51) Int. Cl.
*H01L 23/31* (2006.01)
*H01L 23/29* (2006.01)
(Continued)

(52) U.S. Cl.
CPC ........ *H01L 23/3142* (2013.01); *H01L 21/565* (2013.01); *H01L 23/296* (2013.01);
(Continued)

(58) Field of Classification Search
CPC .............. H01L 23/296; H01L 23/3107; H01L 23/3135; H01L 23/3142; H01L 23/5389
See application file for complete search history.

(56) References Cited

U.S. PATENT DOCUMENTS 6,273,985 B1 * 8/2001 DeLouise .................. B41J 2/16
156/273.3
2003/0129347 A1    7/2003 Yamakawa et al.
(Continued)

FOREIGN PATENT DOCUMENTS

EP              0691681 A2 *  1/1996  ......... H01L 23/3142
WO    WO-2018057040 A1      3/2018

OTHER PUBLICATIONS

"International Application Serial No. PCT/US2016/053818, International Search Report dated Jun. 7, 2017", 3 pgs.
(Continued)

*Primary Examiner* — Matthew E Warren
(74) *Attorney, Agent, or Firm* — Schwegman Lundberg & Woessner, P.A.

(57) ABSTRACT

Various embodiments disclosed relate to semiconductor device and method of making the same using functional silanes. In various embodiments, the present invention provides a semiconductor device including a silicon die component having a first silica surface. The semiconductor device includes a dielectric layer having a second surface generally facing the first silica surface. The semiconductor device includes an interface defined between the first surface and the second surface. The semiconductor device also includes a silane based adhesion promoter layer disposed within the junction and bonded to at least one of the first silica surface and the dielectric layer second surface.

14 Claims, 6 Drawing Sheets

(51) Int. Cl.
  *H01L 23/538* (2006.01)
  *H01L 21/56* (2006.01)
  *H01L 23/367* (2006.01)

(52) U.S. Cl.
  CPC ...... *H01L 23/3107* (2013.01); *H01L 23/3135* (2013.01); *H01L 23/3675* (2013.01); *H01L 23/5381* (2013.01); *H01L 23/5383* (2013.01); *H01L 23/5386* (2013.01); *H01L 23/5389* (2013.01)

(56) References Cited

U.S. PATENT DOCUMENTS

| | | | |
|---|---|---|---|
| 2004/0101667 A1 | 5/2004 | Oloughlin et al. | |
| 2005/0049350 A1 | 3/2005 | Tonapi et al. | |
| 2007/0272123 A1 | 11/2007 | Kennedy et al. | |
| 2013/0299965 A1* | 11/2013 | Gandhi | H01L 24/13 257/737 |
| 2013/0337608 A1* | 12/2013 | Kotani | H01L 24/96 438/110 |
| 2014/0120244 A1 | 5/2014 | Wang et al. | |
| 2016/0276300 A1* | 9/2016 | Matsuo | B41J 2/1631 |

OTHER PUBLICATIONS

"International Application Serial No. PCT/US2016/053818, Written Opinion dated Jun. 7, 2017", 6 pgs.

\* cited by examiner

SEMICONDUCTOR DEVICE INCLUDING SILANE BASED ADHESION PROMOTER AND METHOD OF MAKING

This application is a U.S. National Stage Filing under 35 U.S.C. 371 from International Application No. PCT/US2016/053818, filed on Sep. 26, 2016, which application is incorporated herein by reference in its entirety.

BACKGROUND

For embedded substrate components, maintaining strong component adhesion to dielectric material is critical in ensuring signal integrity, quality, and reliability.

Varnish manufacturing companies currently utilize dielectric-to-component adhesion methods that involve the direct mixing of adhesive additives into the varnish of a composite resin that forms the dielectric component. After the resin is cured, the adhesive additive molecules in contact with an embedded component can form covalent chemical bonds—thereby increasing the adhesion between dielectric and component. With this method, only the surface molecules on the dielectric surface are available for chemical bonding and the large fraction within the bulk of the dielectric material remains unutilized. Because the material properties of the bulk resin can be adversely affected at a certain weight percent of adhesion additive, varnish manufacturers are limited to the amount of adhesion that can be introduced at the dielectric-to-component interface.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION OF THE INVENTION

Figure 1:
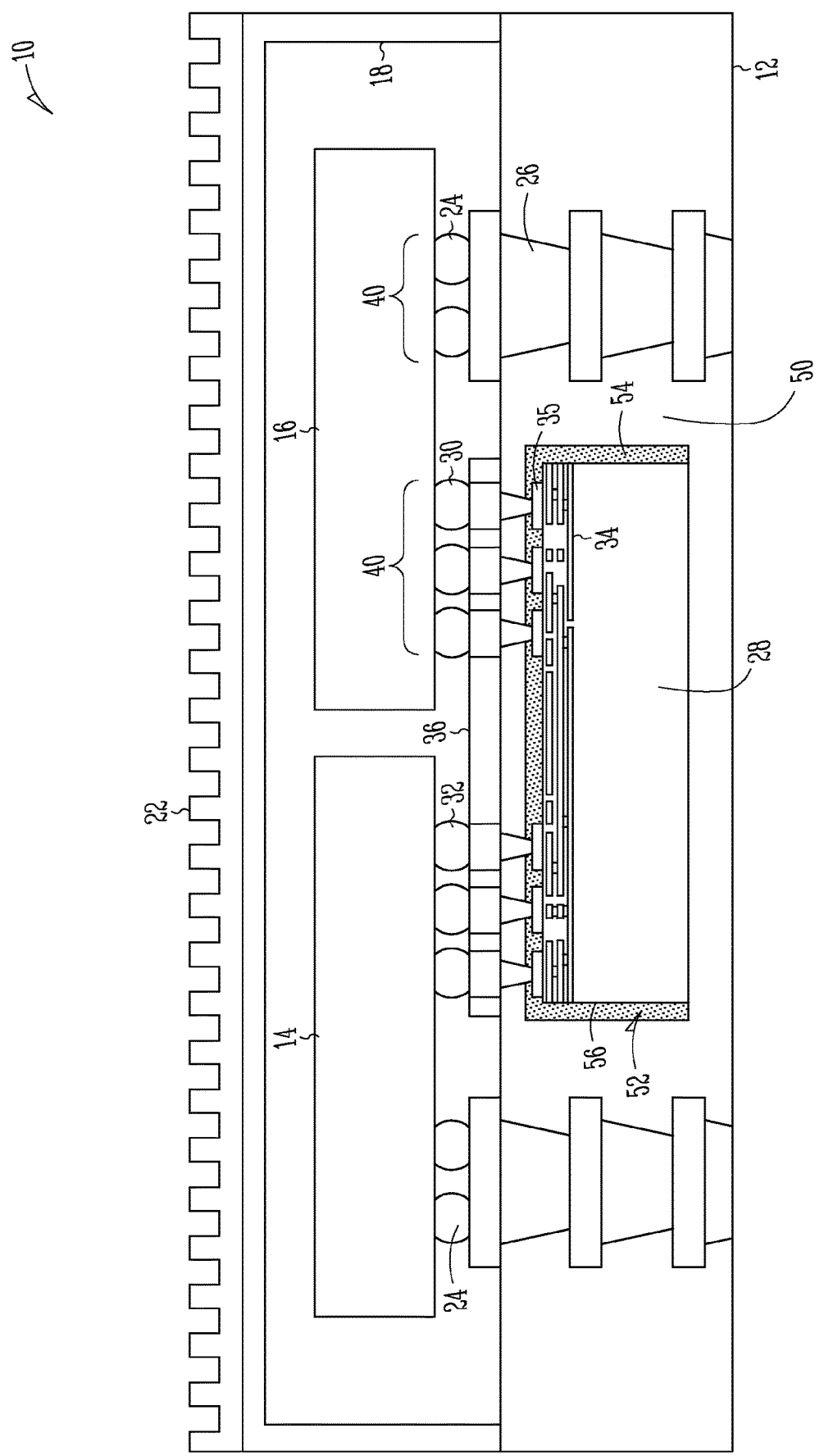
FIG. 1 is a cross-sectional diagram of a semiconductor device using an embedded interconnect bridge (EMIB™) architecture, in accordance with various embodiments.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

The term "organic group" as used herein refers to any carbon-containing functional group. Examples can include an oxygen-containing group such as an alkoxy group, aryloxy group, aralkyloxy group, oxo(carbonyl) group; a carboxyl group including a carboxylic acid, carboxylate, and a carboxylate ester; a sulfur-containing group such as an alkyl and aryl sulfide group; and other heteroatom-containing groups. Non-limiting examples of organic groups include OR, OOR, OC(O)N(R)$_2$, CN, CF$_3$, OCF$_3$, R, C(O), methylenedioxy, ethylenedioxy, N(R)$_2$, SR, SOR, SO$_2$R, SO$_2$N(R)$_2$, SO$_3$R, C(O)R, C(O)C(O)R, C(O)CH$_2$C(O)R, C(S)R, C(O)OR, OC(O)R, C(O)N(R)$_2$, OC(O)N(R)$_2$, C(S)N(R)$_2$, (CH$_2$)$_{0-2}$N(R)C(O)R, (CH$_2$)$_{0-2}$N(R)N(R)$_2$, N(R)N(R)C(O)R, N(R)N(R)C(O)OR, N(R)N(R)CON(R)$_2$, N(R)SO$_2$R, N(R)SO$_2$N(R)$_2$, N(R)C(O)OR, N(R)C(O)R, N(R)C(S)R, N(R)C(O)N(R)$_2$, N(R)C(S)N(R)$_2$, N(COR)COR, N(OR)R, C(=NH)N(R)$_2$, C(O)N(OR)R, C(=NOR)R, and substituted or unsubstituted ($C_1$-$C_{100}$)hydrocarbyl, wherein R can be hydrogen (in examples that include other carbon atoms) or a carbon-based moiety, and wherein the carbon-based moiety can be substituted or unsubstituted.

The term "alkyl" as used herein refers to straight chain and branched alkyl groups and cycloalkyl groups having from 1 to 40 carbon atoms, 1 to about 20 carbon atoms, 1 to 12 carbons or, in some embodiments, from 1 to 8 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and anteisoalkyl groups as well as other branched chain forms of alkyl. Representative substituted alkyl groups can be substituted one or more times with any of the groups listed herein, for example, amino, hydroxy, cyano, carboxy, nitro, thio, alkoxy, and halogen groups.

The term "alkenyl" as used herein refers to straight and branched chain and cyclic alkyl groups as defined herein, except that at least one double bond exists between two carbon atoms. Thus, alkenyl groups have from 2 to 40 carbon atoms, or 2 to about 20 carbon atoms, or 2 to 12 carbon atoms or, in some embodiments, from 2 to 8 carbon atoms. Examples include, but are not limited to vinyl, —CH=CH(CH$_3$), —CH=C(CH$_3$)$_2$, —C(CH$_3$)=CH$_2$, —C(CH$_3$)=CH(CH$_3$), —C(CH$_2$CH$_3$)=CH$_2$, cyclohexenyl, cyclopentenyl, cyclohexadienyl, butadienyl, pentadienyl, and hexadienyl among others.

The term "aryl" as used herein refers to cyclic aromatic hydrocarbon groups that do not contain heteroatoms in the ring. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In some embodiments, aryl groups contain about 6 to about 14 carbons in the ring portions of the groups. Aryl groups can be unsubstituted or substituted, as defined herein. Representative substituted aryl groups can be mono-substituted or substituted more than once, such as, but not limited to, a phenyl group substituted at any one or more of 2-, 3-, 4-, 5-, or 6-positions of the phenyl ring, or a naphthyl group substituted at any one or more of 2- to 8-positions thereof.

The term "amine" as used herein refers to primary, secondary, and tertiary amines having, e.g., the formula N(group)$_3$ wherein each group can independently be H or non-H, such as alkyl, aryl, and the like. Amines include but are not limited to R—NH$_2$, for example, alkylamines, arylamines, alkylarylamines; R$_2$NH wherein each R is independently selected, such as dialkylamines, diarylamines, aralkylamines, heterocyclylamines and the like; and R$_3$N wherein each R is independently selected, such as trialkylamines, dialkylarylamines, alkyldiarylamines, triarylamines, and the like. The term "amine" also includes ammonium ions as used herein.

The terms "halo," "halogen," or "halide" group, as used herein, by themselves or as part of another substituent, mean, unless otherwise stated, a fluorine, chlorine, bromine, or iodine atom.

The term "hydrocarbon" or "hydrocarbyl" as used herein refers to a molecule or functional group that includes carbon and hydrogen atoms. The term can also refer to a molecule or functional group that normally includes both carbon and hydrogen atoms but wherein all the hydrogen atoms are substituted with other functional groups.

As used herein, the term "hydrocarbyl" refers to a functional group derived from a straight chain, branched, or cyclic hydrocarbon, and can be alkyl, alkenyl, alkynyl, aryl, cycloalkyl, acyl, or any combination thereof. Hydrocarbyl groups can be shown as ($C_a$-$C_b$)hydrocarbyl, wherein a and b are integers and mean having any of a to b number of carbon atoms. For example, ($C_1$-$C_4$)hydrocarbyl means the hydrocarbyl group can be methyl ($C_1$) ethyl ($C_2$), propyl ($C_3$), or butyl ($C_4$), and ($C_0$-$C_b$)hydrocarbyl means in certain embodiments there is no hydrocarbyl group.

The term "cure" as used herein refers to exposing to radiation in any form, heating, or allowing to undergo a physical or chemical reaction that results in hardening or an increase in viscosity. A flowable thermoplastic material can be cured by cooling it such that the material hardens. A flowable thermoset material can be cured by heating or otherwise exposing to irradiation such that the material hardens.

Herein, when it is designated that a variable in the structure can be "a bond," the variable can represent a direct bond between the two groups shown as linked to that variable, such as a single bond.

As used herein, the term "polymer" refers to a molecule having at least one repeating unit and can include copolymers.

In various embodiments, the present invention provides a semiconductor device including a silicon die component having a first silica surface. The semiconductor device includes a dielectric layer having a second surface generally facing the first silica surface. The semiconductor device includes an interface defined between the first surface and the second surface. The semiconductor device also includes a silane based adhesion promoter layer disposed within the interface that can bond with at least one of the first silica surface and the dielectric layer second surface.

In various embodiments, the present invention provides a semiconductor device including an interface between a dielectric layer and a silicon die having a silica surface including an adhesion promotor formed from an bifunctional silane derivative, which forms an adhesion promotor layer. The adhesion promotor layer has the structure:

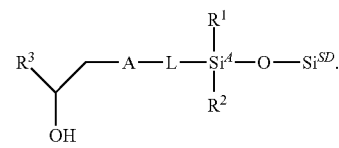

The variable A is chosen from —NR$^4$—, —O—, and —S—. The variable R$^4$ is chosen from —H and ($C_1$-$C_{20}$)hydrocarbyl. The variable L is chosen from a bond and ($C_1$-$C_{20}$) hydrocarbylene. The variable Si$^{SD}$ is a silicon atom in the silicon die. The variable R$^1$ is chosen from —H, ($C_1$-$C_{20}$) hydrocarbyl, —OH, halide, and a crosslink —O-AP wherein AP is another one of the adhesion promotor molecules bonded at the Si$^A$ atom. The variable R$^2$ is chosen from —H, ($C_1$-$C_{20}$)hydrocarbyl, —OH, halide, and a crosslink —O-AP wherein AP is another one of the adhesion promotor molecules bonded at the Si$^A$ atom. The variable R$^3$ is a polymer of the dielectric. The adhesion promoter is first applied to the die and then binds chemically to the dielectric film at the A site after lamination.

In various embodiments, the present invention provides a method of forming a semiconductor device. The method includes treating a first surface of a bifunctional silane surface treatment on an epoxide-functionalized dielectric to form a silane-functionalized intermediate semiconductor device. The bifunctional silane has the structure:

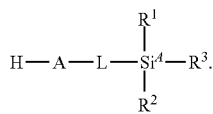

The method further includes reacting the silane-functionalized intermediate semiconductor device with a silicon die, to form the semiconductor device. The semiconductor device has the structure:

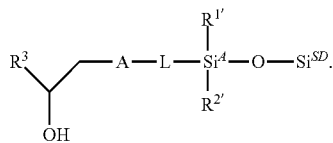

The variable $Si^{SD}$ is a silicon atom in the silicon die. The variable $R^{1'}$ is chosen from —H, $(C_1-C_{20})$hydrocarbyl, —OH, halide, and a crosslink —O-AP wherein AP is another one of the adhesion promotor molecules bonded at the $Si^A$ atom. The variable $R^{2'}$ is chosen from —H, $(C_1-C_{20})$ hydrocarbyl, —OH, halide, and a crosslink —O-AP wherein AP is another one of the adhesion promotor molecules bonded at the $Si^A$ atom. The variable $R^5$ is a polymer of the dielectric.

In various embodiments, the present invention provides a method of forming a semiconductor device, the method includes treating a first surface of a silicon die with a surface treatment composition including a bifunctional silane to form a silane-functionalized intermediate semiconductor device. The bifunctional silane has the structure:

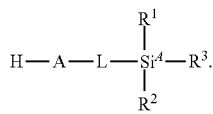

The variable A is chosen from —NR$^4$—, —OR$^4$, and —SH The variable $R^4$ is chosen from —H and $(C_1-C_{20})$ hydrocarbyl. The variable L is chosen from a bond and $(C_1-C_{20})$hydrocarbylene. The variable $R^1$ is chosen from —H, $(C_1-C_{20})$hydrocarbyl, —OH, and a halide. The variable $R^2$ is chosen from —H, $(C_1-C_{20})$hydrocarbyl, —OH, and a halide. The variable $R^3$ is chosen from —H, $(C_1-C_{20})$ hydrocarbyl, —OH, and a halide.

The method further includes reacting the silane-functionalized intermediate semiconductor device with a dielectric component, to form the semiconductor device, the semiconductor device has the structure:

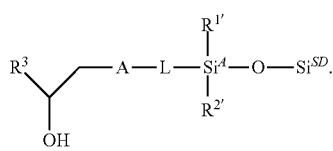

The variable $Si^{SD}$ is a silicon atom in the silicon die. The variable $R^{1'}$ is chosen from —H, $(C_1-C_{20})$hydrocarbyl, —OH, halide, and a crosslink —O-AP wherein AP is another one of the adhesion promotor molecules bonded at the $Si^A$ atom. The variable $R^{2'}$ is chosen from —H, $(C_1-C_{20})$ hydrocarbyl, —OH, halide, and a crosslink —O-AP wherein AP is another one of the adhesion promotor molecules bonded at the $Si^A$ atom. The variable $R^5$ is a polymer of the dielectric.

The present invention provides numerous advantages over conventional industry techniques, some of which are unexpected. For example, various embodiments of the invention allow for direct surface treatment on either the dielectric layer or silicon die. This directly targets the interface of interest and increases the amount of adhesive promoter molecules at the adhesion interface. The surface treatment or adhesion layer described herein prevents dispersion of the silane molecules within the dielectric layer, which ensures the material properties of the dielectric layer will not be altered by increasing the amount of adhesion promoter within the dielectric layer—a major limitation of conventional methods.

The increased amount of adhesive promotors at the interface also results in increased proximity of adjacent adhesive promotors. The increased proximity can lead to crosslinking between adjacent adhesive promotors forming a siloxane network. The crosslinking ability of the individual adhesive promotors not only strengthens the adhesive promoter layer, but also can increase the hydrophobicity, which can substantially prevent water from interacting with the surface of the silica die or dielectric component.

Semiconductor Device.

FIG. 1 is a cross-sectional diagram of a semiconductor device using an Embedded Multi-die Interconnect Bridge (EMIB™) architecture. In one example, device 10 is formed from substrate 12 that exhibits an embedded patterned die 28, which serves as a communication pathway for the functional surface dies 14 and 16. Cover 18 covers substrate 12 and dies 14 and 16. Cooling solution 22 such as cooling fins, as shown in this example, are attached to the top of cover 18. A variety of different cooling solutions may be used such as conductive plates, integrated heat spreaders, liquid cooling, heat pipes, or radiative fins as shown depending on the particular embodiment. Alternatively, the device may be fabricated without the cooling solution and even without cover 12.

Device substrate 12 can include internal low density interconnect routing for communicating between surface dies 14 and 16. Substrate 12 include embedded components of a semiconductor material (e.g., a silicon, gallium, indium, germanium, or variations or combinations thereof) and one or more insulating layers, such as organic based build up film, glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), or any other dielectric layer, that can be used in printed circuit boards (PCBs). Substrate 12 can be made using a bumpless buildup layer process (BBUL) or other technique. A BBUL process includes one or more build-up layers formed around an element, such as a high density interconnect element or bridge 28 or die 14, 16. A micro via formation process, such as laser drilling, can form connections between build-up layers and die bond pads. The build-up layers may be formed using a high-density integration patterning technology.

Dies 14 and 16 can be many types of dies. In one example die can be a memory die and die 16 can be a central processing unit (CPU) die. In other examples both dies 14 and 16 can be memory dies or CPU dies. Dies 14 and 16 are coupled through C4 bumps 24 and vias 26 to a power source outside the device (not shown). While only one pair of C4 bumps 24 is shown for each die, 14, 16 coupled to a single via 26, there may be many connection points for each die 14, 16 coupled through many vias 26 to connect the dies with the device and to external circuitry. The overall package 10 may be connected directly to a printed circuit board (PCB) or coupled to a socket that is attached to some other device such as another (PCB).

Dies 14 and 16 can include low density interconnect pad 42, such as can be used for power, ground, or other electrical coupling. Low density interconnect pad 42 can be electrically coupled, such as through low density interconnect element 26, to a bus (not shown) such as a power, ground, or data bus. The low density interconnect pad can also be electrically coupled to an electrically conductive pad, such as through conductive adhesive (not shown). The conductive adhesive can be solder (e.g., solder paste), electroplating, or microball, such as a microball configured for flip device interconnect (e.g., controlled collapse device connection (C4) interconnect).

Embedded within the substrate is bridge die 28 also known as an interconnect bridge. Bridge die 28 is made of silicon and has a silica surface. Bridge die 28 connects to CPU die 16 and memory die 14 through 30 and 32 bumps. These connectors, 30 and 32, may be through solder balls 32, C4 connection areas or any other preferred type of connection to make electrical connection from one die 14, 16 through the connectors 30, 32 into bridge die 28. The connections are made through pads on bridge pad layer 35 on the top of the bridge. Interconnect layers 34 within the bridge make connections between the pins or lands on each die to pins or lands on the other die 14, 16. In this way, the CPU and memory may communicate data and control information within the package.

In one example, as shown in FIG. 1 CPU die 16 has first interconnect area 40 closest to memory 14 for connecting through the embedded bridge die 28 to memory 14. CPU 16 has second interconnect area 42 for connecting with external vias 26 for power and external data input and output. Second interconnect area 42 may be divided into power interconnect areas and data interconnect areas.

Bridge die 28 includes electrically conductive pads at least partially on or in a top surface of bridge die 28. The electrically conductive pads can include conductive metal, such as copper, gold, silver, aluminum, zinc, nickel, brass, bronze, iron, etc.

In addition, power rail 36 above bridge pad layer 35 receives power from outside the device through separate power vias (not shown) and provides this power to the bridge interconnect area 40 of the memory 14 and CPU 16. Power rail 36 may be formed of metal layers deposited printed over the substrate 12.

In one example, dielectric layer 50 can be formed over bridge die 28 and substrate 12. Dielectric layer 50 allows for dimensional variations in the placement, and embedding, the bridge and electrically isolates all of the interconnection areas. Dielectric layer 50 can be formed from an epoxy-based resin such as bisphenol A, epoxy resin, a bisphenol F epoxy resin, a novolac epoxy resin, an aliphatic epoxy resin, a glycidylamine epoxy resin, and a glycidylamine epoxy resin, or any other resin including one or more terminal epoxy groups. In some embodiments dielectric layer 50 includes one layer having a thickness ranging from about 5 microns to about 50 microns or about 15 microns to 45 microns, or from 20 microns to 35 microns or about 30, or less than, equal to, or greater than about 15 microns, 20 microns, 25 microns, 30 microns, 35 microns, 40, microns, or 45 microns.

A surface of dielectric layer 50 and a surface of bridge die 28 are joined at interface 52. As stated herein dielectric layer 50 is formed from an epoxy based resin and bridge die 28 is formed from silicon and has a silica surface. Thus, interface 52 is formed from two dissimilar materials. In order to adhere dielectric layer 50 and bridge die 28, adhesion promotor 54 layer is applied to interface 52. As will be described further, adhesion promotor layer 54 is formed from a plurality of silane based adhesion promotor molecules that include a silicon atom bonded to an organic group and three hydroxyl groups. All silane-based adhesion promotor molecules assemble into a monolayer and are bonded the dielectric layer 50 and bridge die 28. In some embodiments, adhesion promotor layer 54 is only located at interface 52 and is not present on other surface of dielectric layer 50 or bridge die 28.

Figure 2:
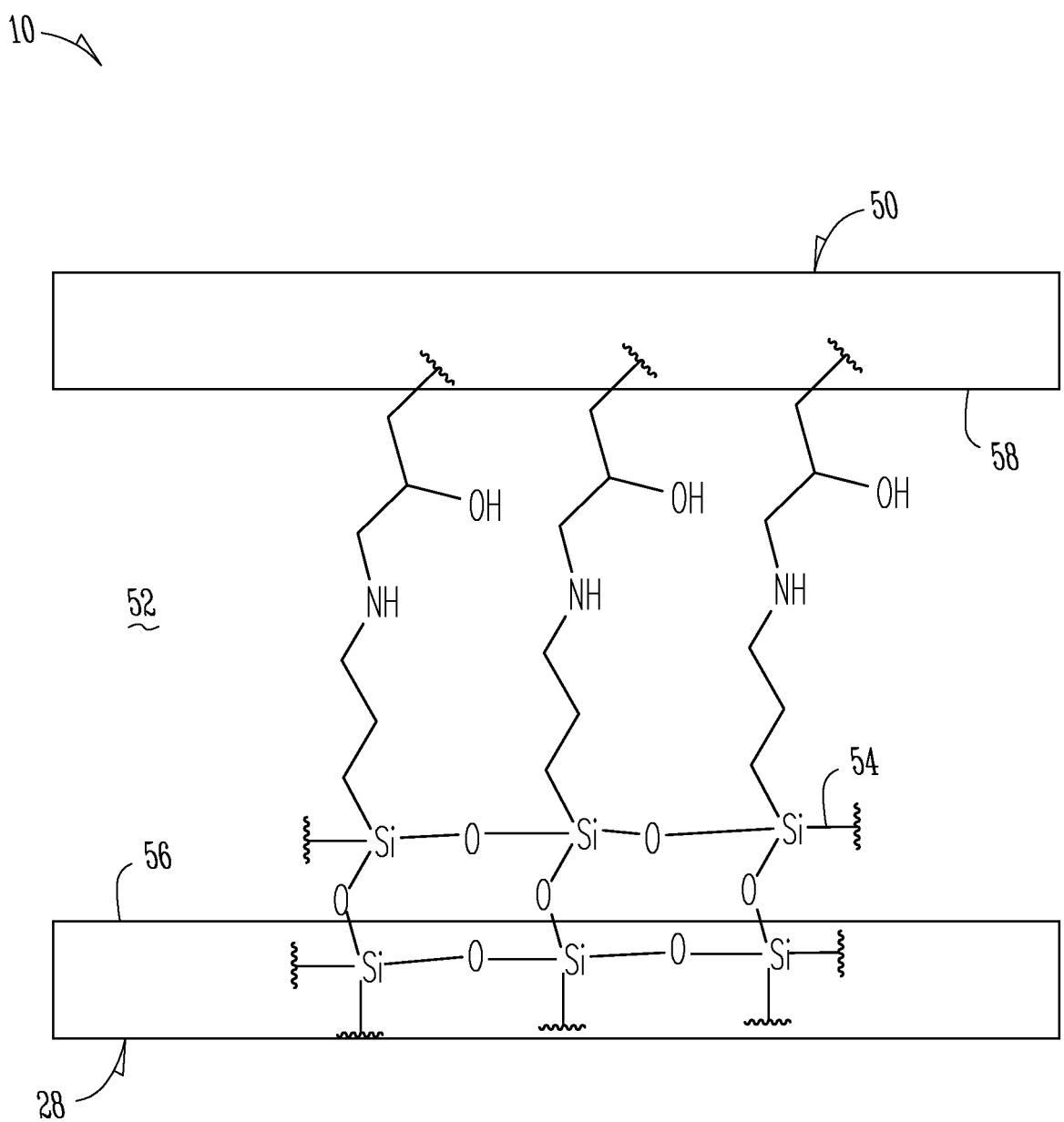
FIG. 2 is a schematic diagram of the semiconductor device showing a plurality of adhesion promotor molecules as a monolayer joining a dielectric layer and a silicon die. The adhesion layer is disposed across the interface between the substrate and silicon die, in accordance with various embodiments.

As shown in FIG. 2, in various embodiments, the present invention provides a semiconductor device 10 including bridge die 28, or other silicon die layer having first silica surface 56. Semiconductor device 10 can include dielectric layer 50 having second surface 58 generally facing first silica surface 56. Semiconductor device 10 can include interface 52 defined between first surface 56 and second surface 58. Semiconductor device 10 can include silane based adhesion promoter layer 54 disposed within interface 52 and bonded to at least one of first silica surface 56 and the dielectric layer second surface 58.

In various embodiments, silane based adhesion promotor layer 54 is bonded to both of the silica die first surface 56 and dielectric layer second surface 58. This forms a monolayer in which each silane based adhesion promotor molecule is bonded to an adjacent adhesion promoter molecule by a siloxane bond. Adhesion promotor layer 54 is bonded to silica die first surface 56 by a siloxane bond and is bonded to dielectric layer second surface 58 though a covalent bond that is formed from a nucleophilic substitution reaction between the nucleophilic group of silane based adhesion promoter molecule and an epoxy group on dielectric layer 50. In other embodiments each silane based adhesion promoter molecule can be attached to surfaces other than silica die first surface 56. The adhesion promoter molecule can in fact be used to bond to any hydroxylated surface in semiconductor 10. For example in addition to silicon die first surface 56, the adhesion promoter molecules can bond to surface hydroxyl groups of components formed from copper, tin, or other metals or organic materials.

In some embodiments of the present invention dielectric layer 50 can be formed from multiple layers of material. For example, dielectric layer 50 can be formed from a base layer of epoxy resin or other dielectric layer as described above and further can include a second layer of epoxy-based resin that is bonded to the base layer. The second layer of epoxy based resin can have a thickness ranging from about 1 micron to about 5 microns, or about 2 microns to about 4 microns, or less than, equal to, or greater than about 1.2 microns, 1.4 microns, 1.6 microns, 1.8 microns, 2.0 microns, 2.2 microns, 2.4 microns, 2.6 microns, 2.8 microns, 3.0 microns, 3.2 microns, 3.4 microns, 3.6 microns, 3.8 microns, 4 microns, 4.2 microns, 4.4 microns, 4.6 microns, or 4.8 microns. In some embodiments the adhesion promoting molecules can be bonded to the second layer of epoxy-based resin prior to lamination of dielectric layer 50 onto bridge die 28. In this manner the second layer of epoxy-based resin serves as a primer layer for adhesion between dielectric layer 50 and bridge die 28.

Various embodiments of the present invention provide a semiconductor device packaging including an interface between a dielectric substrate layer and a silicon die, such as bridge die 28, having a silica surface including an adhesion promotor forming adhesive promoter layer. The adhesion promoter interface can have the structure:

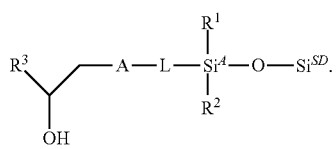

The variable A represents one terminal of the adhesion promoter molecule and can be chosen from an organic group such as —$NR^4$—, —O—, and —S—. The variable $R^4$ can be chosen from —H and alkyl groups such as $(C_1-C_{20})$ hydrocarbyl. The variable L can be chosen from a bond and alkyl groups such as $(C_1-C_{20})$ hydrocarbylene. The variable $Si^{SD}$ can be a silicon atom in the silicon die. The variable $R^1$ can be chosen from —H, $(C_1-C_{20})$ hydrocarbyl, —OH, halide, and a crosslink —O-AP in which AP is another one of the adhesion promotor molecules bonded at the $Si^A$ atom. The variable $R^2$ can be chosen from —H, $(C_1-C_{20})$ hydrocarbyl, —OH, halide, and a crosslink —O-AP. AP represents another adhesion promotor molecules that is bonded to the $Si^A$ atom through a siloxane bond. The variable $R^3$ can be a polymer of the dielectric. In other embodiments the variable A can be an amino group such as —NH—. The variable L can be propylene. The variable $R^1$ can be chosen from —OH, and a crosslink —O-AP in which AP is another one of the adhesion promotor molecules bonded at the $Si^A$ atom. The variable $R^2$ can be chosen from —OH, and a crosslink —O-AP in which AP is another one of the adhesion promotor molecules bonded at the $Si^A$ atom.

In various embodiments the adhesion promotor can have the structure:

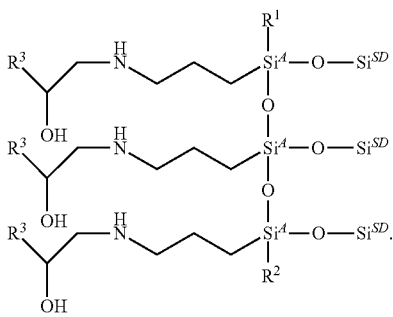

The polymer $R^3$ can form the dielectric layer or be a layer forming dielectric layer can be an epoxy-based resin. The polymer $R^3$ can be any suitable polymer. For example, the polymer $R^3$ can be chosen from a bisphenol A epoxy resin, a bisphenol F epoxy resin, a novolac epoxy resin, an aliphatic epoxy resin, a glycidylamine epoxy resin, and a glycidylamine epoxy resin. The epoxy resin layer having any suitable thickness. In some embodiments the epoxy layer can have a thickness ranging from about 0.5 microns to about 1.5 microns, or about 0.8 to about 1.2 microns, or about 0.5 microns or less, or less than, equal to, or greater than about 0.6 microns, 0.7, 0.8, 0.9, 1, 1.1, 1.2, 1.3, 1.4, or about 1.5 microns or more. In some embodiments the resin layer can be bonded directly to an external surface of the dielectric.

In some embodiments in which adhesive promoter molecules are first bonded to the polymer $R^3$, the polymer $R^3$ can include any suitable amount of the adhesion promoter, such as about 0.1 to 50 wt % of the polymer, or 30 to 40 wt %, or about 35 wt %, or less than, equal to, or greater than about 22 wt %, 24 wt %, 26 wt %, 28 wt %, 30 wt %, 32 wt %, 34 wt %, 36 wt %, 38 wt %, 40 wt %, 42 wt %, 44 wt %, 46 wt %, or 48 wt %.

Figure 3:
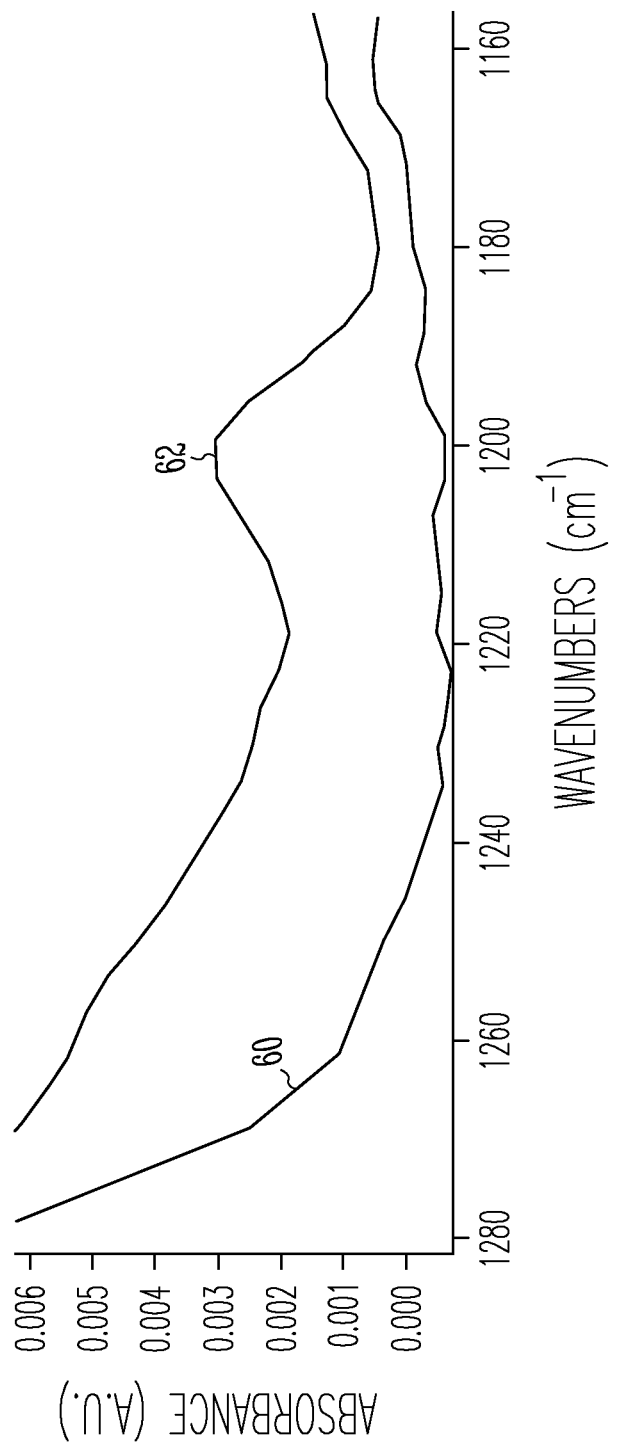
FIG. 3 is an infrared spectrum showing the absorbance of a semiconductor device having the adhesion promotor layer compared to a device without the adhesion promotor layer, in accordance with various embodiments.

The presence of the adhesive promoter layer can be detected in the semiconductor device through various spectroscopy techniques. FIG. 3 shows an infrared spectra of a semiconductor device without monolayer (absorbance line 60). FIG. 3 also shows a semiconductor device having an adhesion promotor monolayer as described herein (line 62). Line 62 shows an absorption band at approximately 1205 cm$^{-1}$, which indicates Si—C bond stretching. A Si—C bond is present in some embodiments of the adhesion promotor monolayer but not in a semiconductor device without adhesion promoting monolayer. Thus, the presence of an adhesion promoting monolayer can be confirmed. Additional spectroscopy techniques that can be used to identify whether adhesion promoting monolayer is present include X-ray photoelectron spectroscopy (XPS), time of flight secondary ion mass spectrometry (TOF SIMS), Raman spectroscopy, atomic force microscopy (AFM), energy dispersive X-ray spectroscopy (EDX), wavelength dispersive X-ray spectroscopy (WDS), inverse gas chromatography (IGC), and pyrolysis gas chromatography (PGC).

Figure 4:
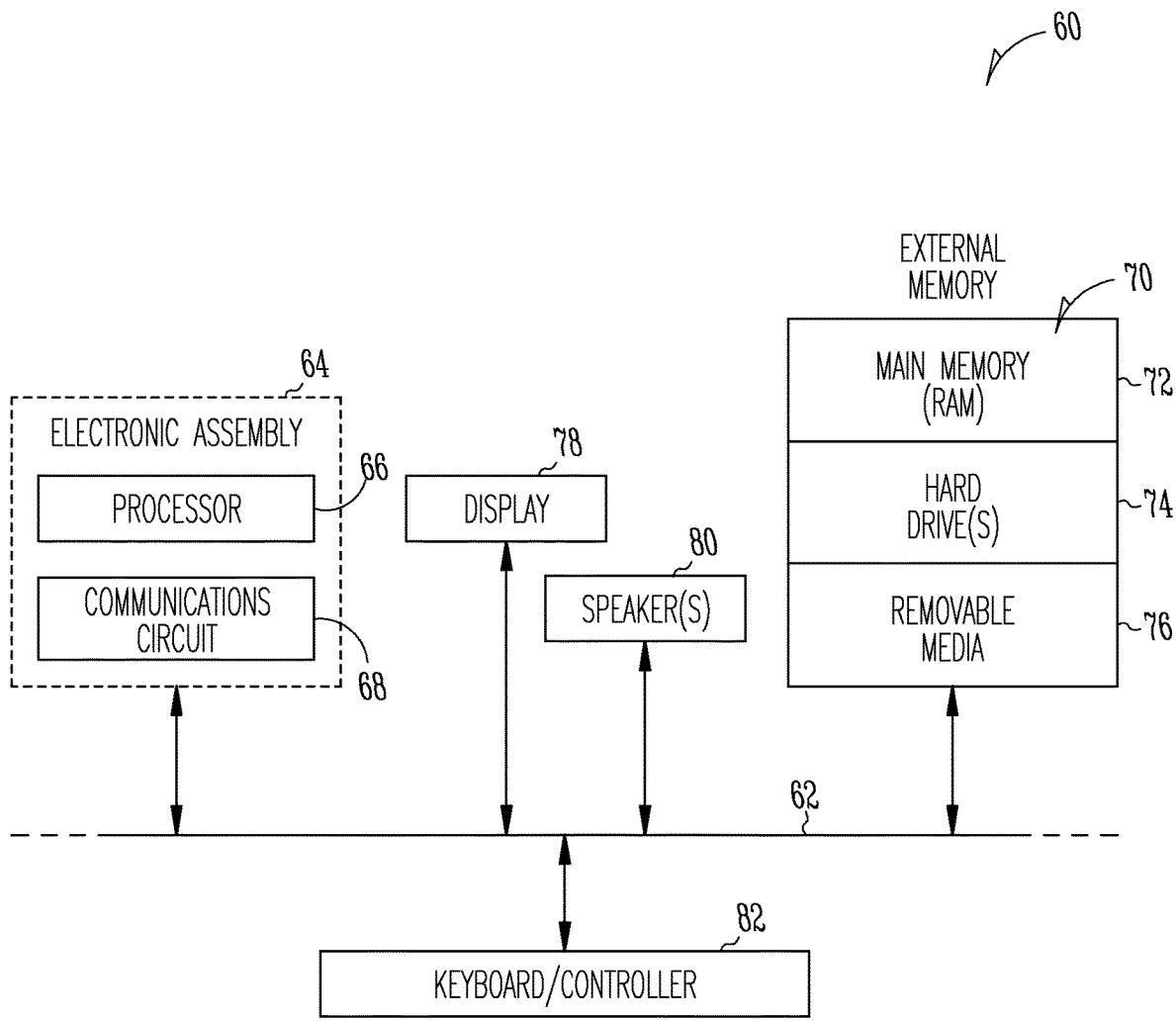
FIG. 4 is a block diagram of an electronic system, in accordance with various embodiments.

Semiconductor device 10 can be incorporated into many different electronic devices. EMIB™ is one such technology incorporating device 10, which provides integration of different components into one package through ultra-high density interconnections. Examples of some application are shown in FIG. 4, which depicts a block diagram of an electronic device 60 incorporating at least one solder and/or method in accordance with at least one embodiment of the invention. Electronic device 60 is merely one example of an electronic system in which embodiments of the present invention can be used. Examples of electronic devices 60 include, but are not limited to high performance devices, data centers, servers, personal computers, tablet computers, mobile telephones, game devices, MP3 or other digital music players, etc. In this example, electronic device 60 comprises a data processing system that includes a system bus 62 to couple the various components of the system. System bus 62 provides communications links among the various components of the electronic device 60 and can be implemented as a single bus, as a combination of busses, or in any other suitable manner.

An electronic assembly 64 is coupled to system bus 62. The electronic assembly 64 can include any circuit or combination of circuits. In one embodiment, the electronic assembly 64 includes a processor 66 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 64 are a custom circuit, an application-specific integrated circuit (ASIC), or the like, such as, for example, one or more circuits (such as a communications circuit 68) for use in wireless devices like mobile telephones, personal data assistants, portable computers, two-way radios, and similar electronic systems. The IC can perform any other type of function.

The electronic device 60 can also include an external memory 70, which in turn can include one or more memory elements suitable to the particular application, such as a main memory 72 in the form of random access memory (RAM), one or more hard drives 74, and/or one or more drives that handle removable media 76 such as compact disks (CD), flash memory cards, digital video disk (DVD), and the like.

The electronic device 60 can also include a display device 78, one or more speakers 80, and a keyboard and/or controller 82, which can include a mouse, trackball, touch screen, voice-recognition device, or any other device that permits a system user to input information into and receive information from the electronic device 60

Methods of Making a Semiconductor Device.

In various embodiments, the present invention provides a first method of making the semiconductor device. The method can be any suitable method that can form an embodiment of the semiconductor device described herein. The method can include treating a first surface of an epoxide-functionalized dielectric with a surface treatment composition including a bifunctional silane to form a silane-functionalized intermediate semiconductor device. The bifunctional silane can have the structure:

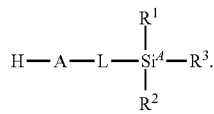

The variable A can be chosen from organic groups such as —$NR^4$—, —O—, and —S—. The variable $R^4$ can be chosen from —H and alkyl groups such $(C_1$-$C_{20})$hydrocarbyl. The variable L can be chosen from a bond and $(C_1$-$C_{20})$hydrocarbylene. The variable $R^1$ can be chosen from —H, $(C_1$-$C_{20})$hydrocarbyl, —OH, and a halide. The variable $R^2$ can be chosen from —H, $(C_1$-$C_{20})$hydrocarbyl, —OH, and a halide. The variable $R^3$ can be chosen from —H, $(C_1$-$C_{20})$hydrocarbyl, —OH, and a halide.

The bifunctional silane reacts with the epoxide-functionalized dielectric through a nucleophilic moiety, A, on the silane molecule. In the reaction the nucleophilic variable A attacks an epoxy group on the surface of the dielectric component.

The silane-functionalized intermediate semiconductor device can then be reacted with a surface hydroxyl group of a silicon die, through a silanization reaction to form the semiconductor device. The silanization reaction can be carried out at a temperature ranging from about 50-300 degrees Celsius or about 100 to 200 degrees Celsius. The semiconductor device can have the structure:

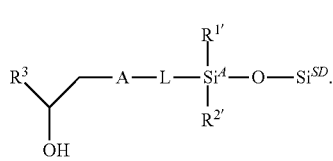

The variable A can be chosen from organic groups such as —$NR^4$—, —O—, and —S—. The variable $R^4$ can be chosen from —H and $(C_1$-$C_{20})$hydrocarbyl. The variable L can be chosen from a bond and $(C_1$-$C_{20})$hydrocarbylene. $Si^{SD}$ is a silicon atom in the silicon die. The variable $R^{1''}$ can be chosen from —H, $(C_1$-$C_{20})$hydrocarbyl, —OH, halide, and a crosslink —O-AP in which AP is another one of the adhesion promotor molecules bonded at the $Si^4$ atom. The variable $R^{2'}$ can be chosen from —H, $(C_1$-$C_{20})$hydrocarbyl, —OH, halide, and a crosslink —O-AP in which AP is another one of the adhesion promotor molecules bonded at the $Si^4$ atom. The variable $R^5$ can be a polymer of the dielectric, which can be incorporated into a resin layer bonded to a first surface of the dielectric or a polymer forming the dielectric.

The silane functionalized intermediate can have the structure:

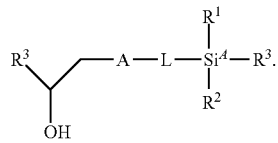

Figure 5:
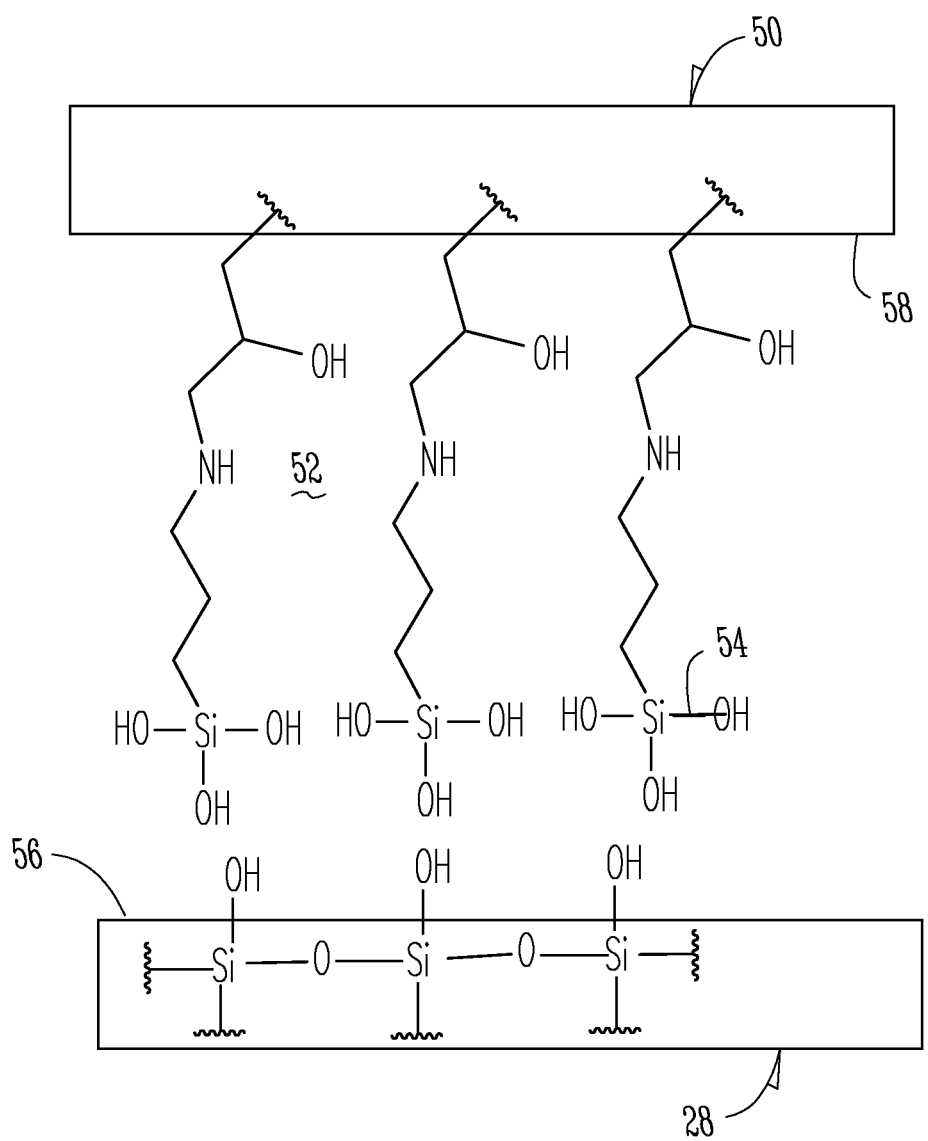
FIG. 5 is a block diagram of the semiconductor device showing a plurality of adhesion promotor molecules attached to the dielectric component, in accordance with various embodiments.

FIG. 5 shows an example of a silane-functionalized intermediate semiconductor device prior to the silanization reaction.

The step of reacting the silane-functionalized intermediate can form a semiconductor device having the structure,

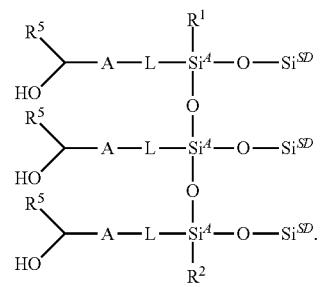

Individual adhesion promotor molecules are crosslinked by a silanization reaction.

In various embodiments, the present invention provides a second method of making the semiconductor device. The method can be any suitable method that can form an embodiment of the semiconductor device described herein. The method can include treating a first surface of a silicon die with a surface treatment composition including a bifunctional silane to form a silane-functionalized intermediate semiconductor device through a silanization reaction. The bifunctional silane can have the structure:

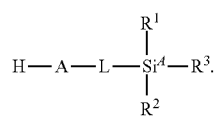

The variable A can be chosen from organic groups such as —$NR^4$—, —$OR^4$, and —SH. The variable $R^4$ can be independently chosen from —H and $(C_1$-$C_{20})$hydrocarbyl. The variable L can be chosen from a bond and $(C_1$-$C_{20})$hydrocarbylene. The variable $Si^{SD}$ can be a silicon atom in the silicon die. The variable $R^1$ can be chosen from —H, $(C_1$-$C_{20})$hydrocarbyl, —OH, and a halide. The variable $R^2$ can be chosen from —H, $(C_1$-$C_{20})$hydrocarbyl, —OH, and a halide. The variable $R^3$ can be chosen from —H, $(C_1$-$C_{20})$hydrocarbyl, —OH, and a halide.

The silane-functionalized intermediate semiconductor device can be reacted with a dielectric component, to form the semiconductor device through a nucleophilic substitution reaction. The semiconductor device can have the structure:

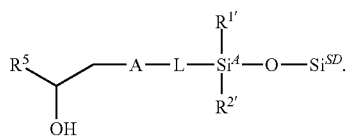

The variable A can be chosen from —$NR^4$—, —O—, and —S—. The variable $R^4$ can be chosen from —H and $(C_1$-$C_{20})$hydrocarbyl. The variable L can be chosen from a bond and $(C_1$-$C_{20})$hydrocarbylene. The variable $Si^{SD}$ can be a silicon atom in the silicon die. The variable $R^{1'}$ is chosen from —H, $(C_1$-$C_{20})$hydrocarbyl, —OH, halide, and a crosslink —O-AP in which AP is another one of the adhesion promotor molecules bonded at the $Si^4$ atom. The variable $R^{2'}$ can be chosen from —H, $(C_1$-$C_{20})$hydrocarbyl, —OH, halide, and a crosslink —O-AP in which AP is another one of the adhesion promotor molecules bonded at the $Si^4$ atom. The variable $R^5$ can be a polymer of the dielectric.

The silane-functionalized intermediate semiconductor device can have the structure:

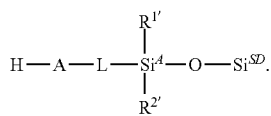

Figure 6:
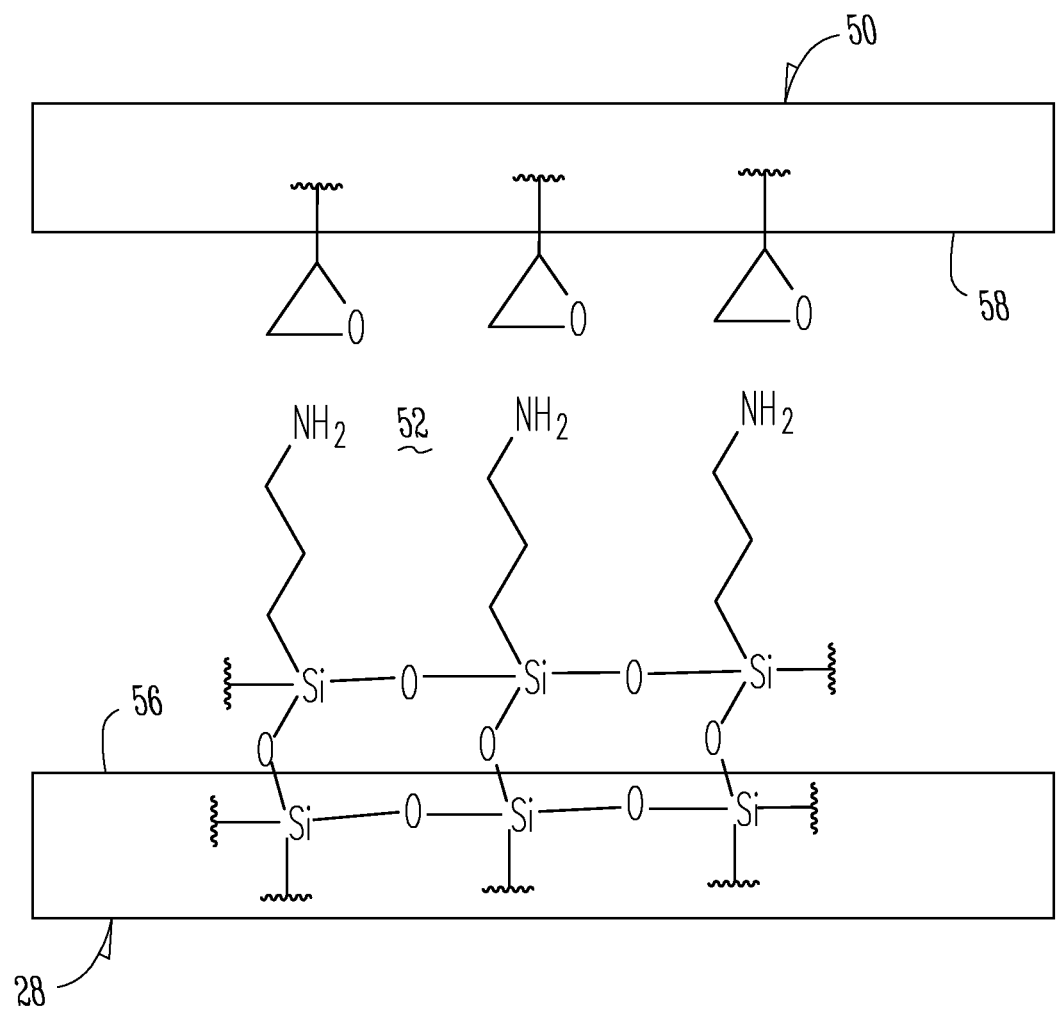
FIG. 6 is a block diagram of the semiconductor device showing a plurality of adhesion promotor molecules attached to the silicon die, in accordance with various embodiments.

FIG. 6 shows an example of a silane-functionalized intermediate semiconductor device prior to the nucleophilic substitution reaction The step of reacting the silane-functionalized intermediate can form a semiconductor device having the structure,

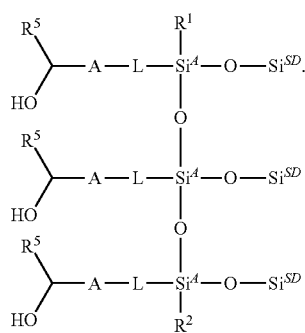

Individual adhesion promotor molecules are crosslinked by a silanization reaction.

Additional Embodiments

The following exemplary embodiments are provided, the numbering of which is not to be construed as designating levels of importance:

Embodiment 1 provides a semiconductor device comprising:
an embedded component having a first hydroxylated surface;
a dielectric layer having a second surface adjacent to the first hydroxylated surface;
an interface defined between the first hydroxylated surface and the second surface; and
a silane based adhesion promoter layer formed from a plurality of adhesion promotor molecules disposed within the interface and bonded to at least one of the first hydroxylated surface and the dielectric layer second surface, wherein at least one pair of adjacent adhesion promotor molecules are bonded to each other.

Embodiment 2 provides the semiconductor device of Embodiment 1, wherein the silane based adhesion promotor layer is bonded to both of the first hydroxylated surface and the dielectric layer second surface.

Embodiment 3 provides the semiconductor device of any one of Embodiments 1-2, wherein the silane based adhesion promotor layer is bonded to the first hydroxylated surface through a siloxane bond.

Embodiment 4 provides the semiconductor device of Embodiment 3, wherein the silane based adhesion promoter layer includes a nucleophilic end group.

Embodiment 5 provides the semiconductor device of any one of Embodiments 1-4, wherein the dielectric layer is formed from an epoxy-based resin.

Embodiment 6 provides the semiconductor device of any one of Embodiments 1-5, wherein the second surface of the dielectric layer comprises a layer of epoxy-based resin that is bonded to the dielectric component.

Embodiment 7 provides the semiconductor device of Embodiment 6, wherein the layer of epoxy-based resin has a thickness ranging from about 1 micron to about 5 microns.

Embodiment 8 provides the semiconductor device of any one of Embodiments 1-7, wherein the silane based adhesion promotor layer is bonded to a terminal epoxy group of the dielectric layer second surface.

Embodiment 9 provides the semiconductor device of any one of Embodiments 1-8, wherein the silane based adhesion promotor layer includes a hydroxyl group.

Embodiment 10 provides semiconductor device of any one of Embodiments 1-9, wherein the silane based adhesion promotor layer comprises:
a first silane group comprising:
a silicon atom;
a nucleophile bonded to the silicon;
a first hydroxyl group;
a second hydroxyl group; and
a third hydroxyl group.

Embodiment 11 provides the semiconductor device of any one of Embodiments 1-10, wherein the silane based adhesion promoter layer further comprises a second silane group.

Embodiment 12 provides the semiconductor device of Embodiment 11, wherein the first hydroxyl group of the first bifunctional silane derivative adhesion promoter is bonded to the first hydroxylated surface of the die by a siloxane bond, and wherein the second hydroxyl group of the first silane group is bonded to at least one hydroxyl group of the second silane group by a siloxane bond.

Embodiment 13 provides the semiconductor device of any one of Embodiments 1-12, wherein the silane based adhesion promotor layer forms a monolayer, wherein each adhesion promotor molecule is attached to the dielectric layer, the first hydroxylated surface, and at least one adjacent adhesion promotor molecule.

Embodiment 14 provides the semiconductor device of any one of Embodiments 1-13, wherein the first hydroxylated surface is a silica surface of a silicon die.

Embodiment 15 provides the semiconductor device of any one of Embodiments 1-14, wherein the silicon die is further connected to a second silicon die.

Embodiment 16 provides a semiconductor device comprising:
an interface between a dielectric layer and a silicon die having a silica surface comprising an adhesion promotor molecule, the adhesion promotor molecule having the structure:
wherein

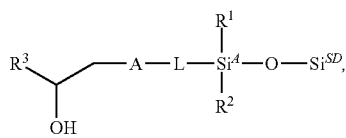

A is chosen from —NR$^4$—, —O—, and —S—,
R$^4$ is chosen from —H and (C$_1$-C$_{20}$)hydrocarbyl,
L is chosen from a bond and (C$_1$-C$_{20}$)hydrocarbylene,
Si$^{SD}$ is a silicon atom in the silicon die,
R$^1$ is chosen from —H, (C$_1$-C$_{20}$)hydrocarbyl, —OH, halide, and a crosslink —O-AP
wherein AP is another one of the adhesion promotor molecules bonded at the Si$^4$ atom,
R$^2$ is chosen from —H, (C$_1$-C$_{20}$)hydrocarbyl, —OH, halide, and a crosslink —O-AP
wherein AP is another one of the adhesion promotor molecules bonded at the Si$^4$ atom, and R$^3$ is a polymer of the dielectric.

Embodiment 17 provides the semiconductor device of Embodiment 16, wherein A is chosen from —NH—, —O—, and —S—.

Embodiment 18 provides the semiconductor device of any one of Embodiments 16-17, wherein A is —NH—.

Embodiment 19 provides the semiconductor device of any one of Embodiments 16-18, wherein R$^4$ is chosen from —H and (C$_1$-C$_5$)alkyl.

Embodiment 20 provides the semiconductor device of any one of Embodiments 16-19, wherein R$^4$ is —H.

Embodiment 21 provides the semiconductor device of any one of Embodiments 16-20, wherein L is (C$_1$-C$_{10}$)alkylene.

Embodiment 22 provides the semiconductor device of any one of Embodiments 16-21, wherein L is propylene.

Embodiment 23 provides the semiconductor device of any one of Embodiments 16-22, wherein
A is —NH—,
L is propylene,
R$^1$ is chosen from —OH, and a crosslink —O-AP wherein AP is another one of the adhesion promotor molecules bonded at the Si$^4$ atom, and
R$^2$ is chosen from —OH, and a crosslink —O-AP wherein AP is another one of the adhesion promotor molecules bonded at the Si$^4$ atom.

Embodiment 24 provides the semiconductor device of any one of Embodiments 16-23, wherein the adhesion promotor has the structure:

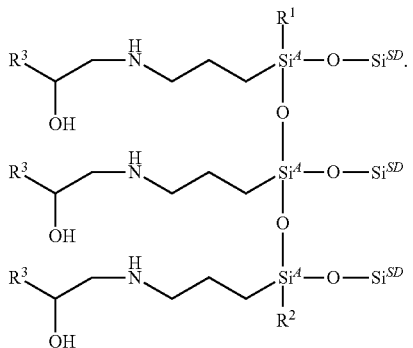

Embodiment 25 provides the semiconductor device of any one of Embodiments 16-24, wherein the semiconductor device a component of an electronic device.

Embodiment 26 provides the semiconductor device of Embodiment 25, wherein the electronic device is chosen from a personal computer, a tablet computer, a mobile telephone, a game device, and a digital music player.

Embodiment 27 provides the semiconductor device of any one of Embodiments 16-26, wherein the polymer R$^3$ is an epoxy-based resin layer having a thickness ranging from about 0.5 microns to about 1.5 microns and the resin layer is bonded directly to an external surface of the dielectric, wherein the adhesion promotor comprises from about 20 to 50 wt % of the polymer.

Embodiment 28 provides the semiconductor device of any one of Embodiments 16-27, wherein the polymer R$^3$ is chosen from a bisphenol A epoxy resin, a bisphenol F epoxy resin, a novolac epoxy resin, an aliphatic epoxy resin, a glycidylamine epoxy resin, and a glycidylamine epoxy resin.

Embodiment 29 provides a method of forming a semiconductor device, the method comprising:
treating a first surface of an epoxide-functionalized dielectric with a surface treatment composition comprising a bifunctional silane to form a silane-functionalized intermediate semiconductor device, the bifunctional silane having the structure,
wherein

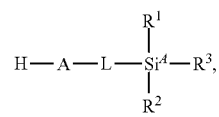

A is chosen from —NR$^4$—, —O—, and —S—,
R$^4$ is chosen from —H and (C$_1$-C$_{20}$)hydrocarbyl,
L is chosen from a bond and (C$_1$-C$_{20}$)hydrocarbylene,
R$^1$ is chosen from —H, (C$_1$-C$_{20}$)hydrocarbyl, —OH, and a halide,
R$^2$ is chosen from —H, (C$_1$-C$_{20}$)hydrocarbyl, —OH, and a halide,
R$^3$ is chosen from —H, (C$_1$-C$_{20}$)hydrocarbyl, —OH, and a halide;
and
reacting the silane-functionalized intermediate semiconductor device with a silicon die, to form the semiconductor device, the semiconductor device having the structure,

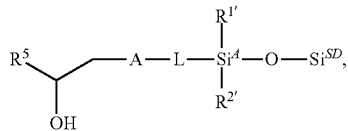

wherein

A is chosen from —NR$^4$—, —O—, and —S—,

R$^4$ is chosen from —H and (C$_1$-C$_{20}$)hydrocarbyl,

L is chosen from a bond and (C$_1$-C$_{20}$)hydrocarbylene,

Si$^{SD}$ is a silicon atom in the silicon die,

R$^{1'}$ is chosen from —H, (C$_1$-C$_{20}$)hydrocarbyl, —OH, halide, and a crosslink —O-AP wherein AP is another one of the adhesion promotor molecules bonded at the Si$^A$ atom, R$^{2'}$ is chosen from —H, (C$_1$-C$_{20}$)hydrocarbyl, —OH, halide, and a crosslink —O-AP wherein AP is another one of the adhesion promotor molecules bonded at the Si$^A$ atom, R$^5$ is a polymer of the dielectric.

Embodiment 30 provides the method of forming a semiconductor device of Embodiment 29, wherein the polymer comprises a resin layer bonded to a first surface of the dielectric.

Embodiment 31 provides the method of forming the electric component of any one of Embodiments 29-30, wherein the silane-functionalized intermediate has the structure,

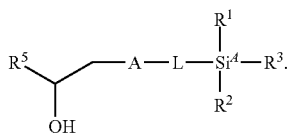

Embodiment 32 provides the method of forming an electric component of any one of Embodiments 29-31, wherein the step of reacting the silane-functionalized intermediate forms a semiconductor device having the structure,

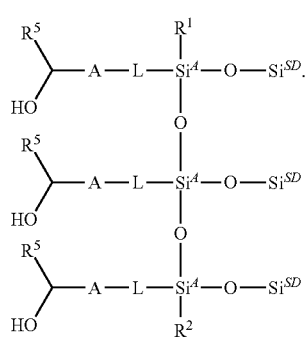

Embodiment 33 provides a method of forming a semiconductor device, the method comprising:

treating a first surface of a silicon die with a surface treatment composition comprising a bifunctional silane to form a silane-functionalized intermediate semiconductor device, the bifunctional silane having the structure,

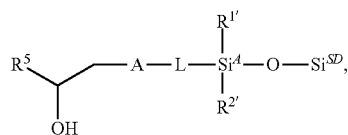

wherein

A is chosen from —NR$^4$—, —OR$^4$, and —SH,

R$^4$ is independently chosen from —H and (C$_1$-C$_{20}$)hydrocarbyl,

L is chosen from a bond and (C$_1$-C$_{20}$)hydrocarbylene,

R$^1$ is chosen from —H, (C$_1$-C$_{20}$)hydrocarbyl, —OH, and a halide,

R$^2$ is chosen from —H, (C$_1$-C$_{20}$)hydrocarbyl, —OH, and a halide, and

R$^3$ is chosen from —H, (C$_1$-C$_{20}$)hydrocarbyl, —OH, and a halide;

and reacting the silane-functionalized intermediate semiconductor device with a dielectric component, to form the semiconductor device, the semiconductor device having the structure,

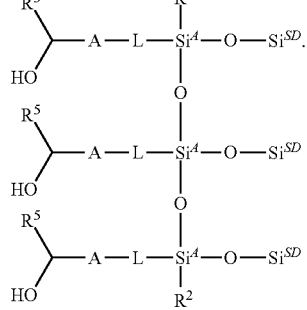

wherein

A is chosen from —NR$^4$—, —O—, and —S—,

R$^4$ is chosen from —H and (C$_1$-C$_{20}$)hydrocarbyl,

L is chosen from a bond and (C$_1$-C$_{20}$)hydrocarbylene,

Si$^{SD}$ is a silicon atom in the silicon die,

R$^{1'}$ is chosen from —H, (C$_1$-C$_{20}$)hydrocarbyl, —OH, halide, and a crosslink —O-AP wherein AP is another one of the adhesion promotor molecules bonded at the Si$^A$ atom, R$^{2'}$ is chosen from —H, (C$_1$-C$_{20}$)hydrocarbyl, —OH, halide, and a crosslink —O-AP wherein AP is another one of the adhesion promotor molecules bonded at the Si$^A$ atom, R$^5$ is a polymer of the dielectric.

Embodiment 34 provides the method of Embodiment 33, wherein the silane-functionalized intermediate semiconductor device has the structure $$H-A-L-\underset{R^{2'}}{\overset{R^{1'}}{\underset{|}{\overset{|}{Si^A}}}}-O-Si^{SD}.$$

Embodiment 35 provides the method of any one of Embodiments 33-34, wherein the step of treating the first surface of the silicon die comprises a silanization reaction with the silicon die to form a siloxane bond between the bifunctional silane and the silicon die.

What is claimed is:

1. A semiconductor device comprising:

an embedded component having a first hydroxylated surface;

a dielectric layer having a second surface adjacent to the first hydroxylated surface;

a bond formed at an interface defined between the first hydroxylated surface and the second surface; and a silane based adhesion promoter layer formed from a plurality of adhesion promotor molecules disposed within the interface and bonded to at least one of the first hydroxylated surface and the dielectric layer second surface, wherein at least one pair of adjacent adhesion promotor molecules are bonded to each other, wherein the first hydroxylated surface is a silica surface of a silicon die.

2. The semiconductor device of claim 1, wherein the silane based adhesion promotor layer is bonded to both of the first hydroxylated surface and the dielectric layer second surface.

3. The semiconductor device of claim 1, wherein the silane based adhesion promotor layer is bonded to the first hydroxylated surface through a siloxane bond.

4. The semiconductor device of claim 3, wherein the silane based adhesion promoter layer includes a nucleophilic end group.

5. The semiconductor device of claim 1, wherein the dielectric layer is formed from an epoxy-based resin.

6. The semiconductor device of claim 1, wherein the second surface of the dielectric layer comprises a layer of epoxy-based resin that is bonded to the dielectric component.

7. The semiconductor device of claim 6, wherein the layer of epoxy-based resin has a thickness ranging from about 1 micron to about 5 microns.

8. The semiconductor device of claim 1, wherein the silane based adhesion promotor layer is bonded to a terminal epoxy group of the dielectric layer second surface.

9. The semiconductor device of claim 1, wherein the silane based adhesion promotor layer includes a hydroxyl group.

10. The semiconductor device of claim 1, wherein the silane based adhesion promotor layer comprises:

a first silane group comprising:

a silicon atom;

a nucleophile bonded to the silicon;

a first hydroxyl group;

a second hydroxyl group; and a third hydroxyl group.

11. The semiconductor device of claim 1, wherein the silane based adhesion promoter layer further comprises a second silane group.

12. The semiconductor device of claim 11, wherein the first hydroxyl group of the first bifunctional silane derivative adhesion promoter is bonded to the first hydroxylated surface of the die by a siloxane bond, and wherein the second hydroxyl group of the first silane group is bonded to at least one hydroxyl group of the second silane group by a siloxane bond.

13. The semiconductor device of claim 1, wherein the silane based adhesion promotor layer forms a monolayer, wherein each adhesion promotor molecule is attached to the dielectric layer, the first hydroxylated surface, and at least one adjacent adhesion promotor molecule.

14. The semiconductor device of claim 1, wherein the silicon die is further connected to a second silicon die.

* * * * *